United States Patent [19]

Chao

[11] Patent Number: 5,783,848

[45] Date of Patent: Jul. 21, 1998

[54] MEMORY CELL

[75] Inventor: Fang-Ching Chao, Hsinchu, Taiwan

[73] Assignee: United Microelectronics Corporation, Taiwan

[21] Appl. No.: 736,594

[22] Filed: Oct. 24, 1996

[30] Foreign Application Priority Data

Aug. 16, 1996 [TW] Taiwan .................. 85110006

[51] Int. Cl.[6] .................. H01L 27/108; H01L 29/76; H01L 29/94; H01L 31/119
[52] U.S. Cl. .................. 257/296; 257/303; 257/306; 257/309; 257/308
[58] Field of Search .................. 257/296, 298, 257/300, 303, 304, 306, 308, 309; 438/254, 255, 398

[56] References Cited

U.S. PATENT DOCUMENTS

| | | |
|---|---|---|
| 5,071,783 | 12/1991 | Taguchi et al. |
| 5,077,688 | 12/1991 | Kumanoya et al. |
| 5,089,869 | 2/1992 | Matsuo et al. .................. 257/304 |
| 5,102,820 | 4/1992 | Chiba . |
| 5,126,810 | 6/1992 | Gotou . |
| 5,137,842 | 8/1992 | Chan et al. .................. 437/48 |
| 5,142,639 | 8/1992 | Kohyama et al. |
| 5,155,657 | 10/1992 | Oehrlein et al. .................. 432/52 |
| 5,158,905 | 10/1992 | Ahn .................. 437/52 |
| 5,164,337 | 11/1992 | Ogawa et al. |
| 5,172,201 | 12/1992 | Suizu . |
| 5,196,365 | 3/1993 | Gotou . |
| 5,206,787 | 4/1993 | Fujioka .................. 437/52 |
| 5,266,512 | 11/1993 | Kirsch .................. 437/52 |
| 5,274,258 | 12/1993 | Ahn .................. 257/308 |
| 5,338,955 | 8/1994 | Tamura et al. |
| 5,354,704 | 10/1994 | Yang et al. |

(List continued on next page.)

FOREIGN PATENT DOCUMENTS

| | | |
|---|---|---|
| 0 516 031 A1 | 12/1992 | European Pat. Off. |
| 4-26156 | 1/1992 | Japan . |
| 5-21745 A | 1/1993 | Japan . |
| 5-251657 | 9/1993 | Japan . |
| 6-151748 | 5/1994 | Japan .................. 257/303 |
| 2252447 | 5/1992 | United Kingdom .................. 257/306 |
| 2 252 447 A | 8/1992 | United Kingdom . |

OTHER PUBLICATIONS

"Mini-Trenches in Polysilicon For Dram Storage Capacitance Enhancement", IBM Technical Disclosure Bulletin, vol. 33, No. 9, Feb. 1991.

Ema et al., "3-Dimensional Stacked Capacitor Cell for 16M and 64M DRAMS", International Electron Devices Meeting, pp. 592-595, Dec. 1988.

Wakamiya et al., "Novel Stacked Capacitor Cell for 64-Mb DRAM", 1989 Symposium on VLSI Technology Digest of Technical papers, pp. 69-70.

*Primary Examiner*—Sara W. Crane
*Assistant Examiner*—Phat X. Cao
*Attorney, Agent, or Firm*—Rabin & Champagne, P.C.

[57] ABSTRACT

A memory cell having a storage capacitor structure which increases the capacitance by adding surface area to the storage electrode of the capacitor. A transfer transistor with a gate electrode and source-drain electrode areas is formed on a semiconductor substrate. An insulating layer is formed on the semiconductor substrate and the transfer transistor, which has a contact opening exposing one of the source-drain electrode areas as a contact area. A storage capacitor is formed on the insulating layer and electrically coupled to the contact area. The storage capacitor includes a first conductive layer with a vertical frame and at least one horizontal plate. The vertical frame is coupled to the contact area through the contact opening and one of the at least one horizontal plates has a plurality of extending areas which extend out vertically. The vertical frame, the at least one horizontal plate and the extending areas together form the storage electrode of the storage capacitor. A dielectric layer is formed on the first conductive layer. A second conductive layer which acts as an opposed electrode of the capacitor is formed on the dielectric layer.

15 Claims, 18 Drawing Sheets

U.S. PATENT DOCUMENTS

| | | |
|---|---|---|
| 5,371,701 | 12/1994 | Lee et al. . |
| 5,389,568 | 2/1995 | Yun . |
| 5,399,518 | 3/1995 | Sim et al. .................................. 437/52 |
| 5,438,011 | 8/1995 | Blalock et al. . |
| 5,443,993 | 8/1995 | Park et al. . |
| 5,453,633 | 9/1995 | Yun ........................................ 257/309 |
| 5,460,996 | 10/1995 | Ryou . |
| 5,478,768 | 12/1995 | Iwasa . |
| 5,478,770 | 12/1995 | Kim . |
| 5,482,886 | 1/1996 | Park et al. . |
| 5,508,222 | 4/1996 | Sakao . |
| 5,521,419 | 5/1996 | Wakamiya et al. . |
| 5,523,542 | 6/1996 | Chen et al. . |
| 5,543,346 | 8/1996 | Keum et al. . |
| 5,550,080 | 8/1996 | Kim . |
| 5,561,309 | 10/1996 | Cho et al. . |
| 5,561,310 | 10/1996 | Woo et al. . |
| 5,572,053 | 11/1996 | Ema . |
| 5,595,931 | 1/1997 | Kim . |

5,783,848

MEMORY CELL

BACKGROUND OF THE INVENTION

1. Field of the Invention

This invention relates in general to integrated circuit semiconductor memory devices, and more particularly to a structure of a DRAM memory cell having a capacitor which includes a storage electrode constructed having a vertical frame and a horizontal plate, the horizontal plate having a plurality of extending areas which extend out vertically therefrom adding to the storage electrode surface area while reducing the horizontal dimensions of the capacitor.

2. Description of Related Art

A DRAM (dynamic random access memory) is a widely used integrated circuit device, and plays an indispensable role in the electronic industry. FIG. 1 is a circuit diagram illustrating a conventional DRAM memory cell. As shown in FIG. 1, a memory cell includes a transfer transistor T and a storage capacitor C. The source electrode of the transfer transistor T is coupled to a corresponding bit line BL, the drain electrode of the transfer transistor T is coupled to a storage electrode 6 of the storage capacitor C, and the gate electrode of the transfer transistor T is coupled to a corresponding word line WL. An opposed electrode 8 of the storage capacitor C is coupled to a stationary voltage source VCP. A dielectric layer 7 is deposited between the storage electrode 6 and the opposed electrode 8. As known by those skilled in this art, the storage capacitor C is used for storing data, and should have enough capacitance to avoid a loss of data.

In a conventional fabricating process for a DRAM device having a storage capacity below 1 MB, a two dimensional capacitance device, e.g., a planar-type capacitor, is widely used for storing data. As shown in FIG. 2, a field oxide layer 11 is formed on a substrate 10 to define an active region, then gate oxide layer 12, gate electrode layer 13, and source and drain electrode areas 14 are formed in sequence to form a transfer transistor T. On the surface of the substrate 10, a dielectric layer 7 and a conductive layer 8 are formed on one side adjacent to the drain. The area where the dielectric layer 7 and the conductive layer 8 join with the substrate 10 forms a storage capacitor C. However, the planar-type capacitor occupies a relatively large surface area of the device to form the storage capacitor C, which is at odds with the desire for large scale integration of the DRAM device.

A highly integrated DRAM, e.g., with a storage capacity of 4 MB or above, needs to use a three dimensional capacitance structure, such as a stack-type capacitor or a trench type capacitor, in order to realize a structure with reduced surface area requirements.

FIG. 3 is a cross-sectional diagram illustrating the structure of a conventional stack-type capacitor. On a substrate 10, a field oxide layer 11, a gate oxide layer 12, a gate electrode layer 13, and source and drain electrode areas 14 are formed in sequence to construct a transfer transistor T. Next, an insulating layer 15 is formed and a contact opening is formed by etching the source-drain electrode areas 14. Thereafter, a first polysilicon layer 6, which is used as a storage electrode, a dielectric layer 7 and a second polysilicon layer 8, which is used as an opposed electrode, are formed in sequence on the device. In this way, a DRAM memory cell with stack-type capacitor C is completed. A memory cell should offer enough capacitance to assure the operational quality of the device as the size of the device is diminished. However, when a memory cell is even more highly integrated, such as when fabricating a DRAM with a storage capacity of 64 MB or above, the above mentioned structure of a stack-type capacitor is no longer adequate.

FIG. 4 is a cross-sectional diagram illustrating a structure of conventional trench-type capacitor C. First, a transfer transistor T is formed on a substrate 10 by ordinary processing, including a gate oxide layer 12, a gate electrode layer 13, and source and drain electrode areas 14. On the surface of the substrate 10, a deep trench is etched on the side adjacent to the drain electrode 14. Next, a storage capacitor C is formed within the deep trench. The storage capacitor C includes a dielectric layer 7, an opposed electrode polysilicon layer 8 and a storage electrode 6 which is formed by the sidewalls of the substrate 10. However, to raise the capacitance, the structure and the fabricating method of this kind of capacitor may increase the surface area of electrode. Further, during the forming of the deep trench by etching, lattice defects will be generated on the substrate that increase current leakage and influence the characteristics of devices. Also, as the aspect ratio is increased, the etching rate will be decreased which adds to the difficulty of processing and adversely affects the efficiency of production.

SUMMARY OF THE INVENTION

It is therefore an object of the invention to provide a DRAM memory cell structure which maintains a required capacitance while reducing the horizontal dimensions of the storage capacitor.

It is therefore another object of the invention to provide a DRAM memory cell structure having a capacitor which includes a storage electrode having a vertical frame and a horizontal plate, the horizontal plate having a plurality of extending areas extending out vertically from upper and lower surfaces thereof, to thereby increase the surface area of the storage electrode and raise its capacitance, without increasing the horizontal dimensions of the capacitor.

According to one aspect of the invention, a DRAM memory cell includes a transfer transistor having a gate electrode and source-drain electrode areas formed on a semiconductor substrate. An insulating layer is formed on the semiconductor substrate and the transfer transistor having a contact opening exposing one of the source-drain electrode areas as a contact area. A storage capacitor is formed on the insulating layer and electrically coupled to the contact area. The storage capacitor includes a first conductive layer having a vertical frame and a horizontal plate, the vertical frame being coupled to the contact area through the contact opening, and the horizontal plate has a plurality of extending areas which extend out vertically on its upper and/or lower surfaces. The vertical frame, the horizontal plate and the extending areas form a storage electrode of the storage capacitor. A dielectric layer is formed on the first conductive layer. A second conductive layer is formed on the dielectric layer as an opposed electrode of the capacitor.

According to another aspect of the invention, a memory cell structure includes a transfer transistor having a gate electrode and source-drain electrode areas is formed on a semiconductor substrate. An insulating layer is formed on the semiconductor substrate and the transfer transistor having a contact opening exposing one of the source-drain electrode areas as a contact area. A storage capacitor is formed on the insulating layer and is electrically coupled to the contact area. The storage capacitor includes a first conductive layer having a vertical frame, a first horizontal plate and a second horizontal plate. The vertical frame is electrically coupled to the contact area through the contact opening. The first and second horizontal plates are spaced apart, being formed apart in sequence, and extend parallel to the surface of the second insulating layer. The second horizontal plate has a plurality of extending areas which extend out vertically from its upper and/or lower surfaces. The vertical frame, the first and second horizontal plates, and the extending areas together from a storage electrode of the storage capacitor. A dielectric layer is formed on the surface of the first conductive layer, and a second conductive layer is formed on the dielectric layer as an opposed electrode of the capacitor.

The extending areas which extend out vertically can be disposed symmetrically or asymmetrically on the upper and lower surfaces of the horizontal plate.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Embodiment 1

Figure 1:
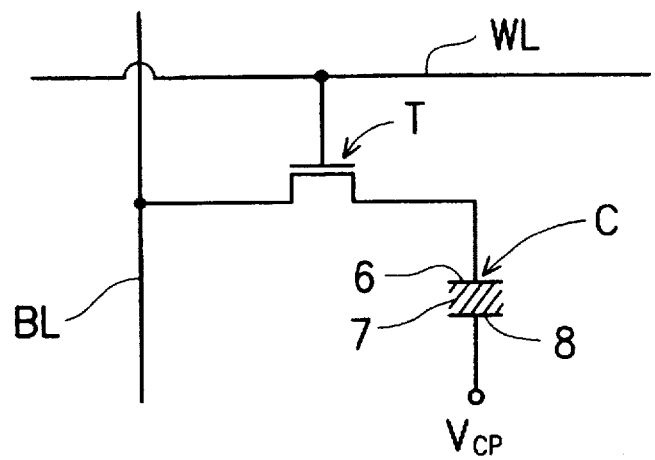
FIG. 1 is a circuit diagram illustrating a conventional DRAM memory cell.
Figure 2:
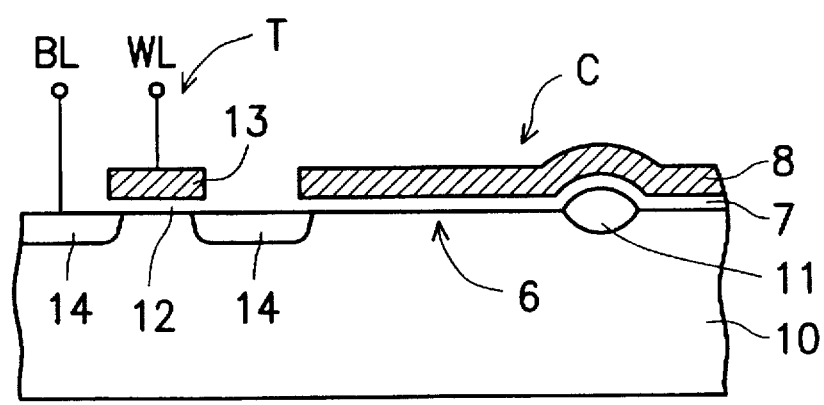
FIG. 2 is a cross-sectional diagram illustrating the structure of a conventional DRAM memory cell with a planar-type capacitor.
Figure 3:
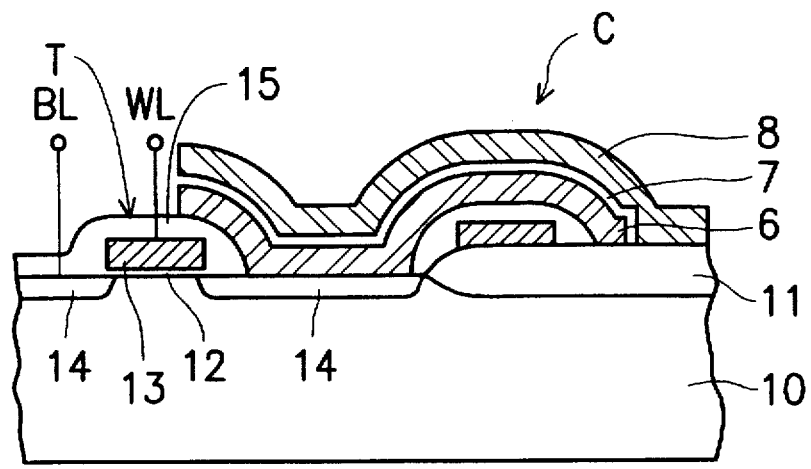
FIG. 3 is a cross-sectional diagram illustrating the structure of a conventional DRAM memory cell with a stack-type capacitor.
Figure 4:
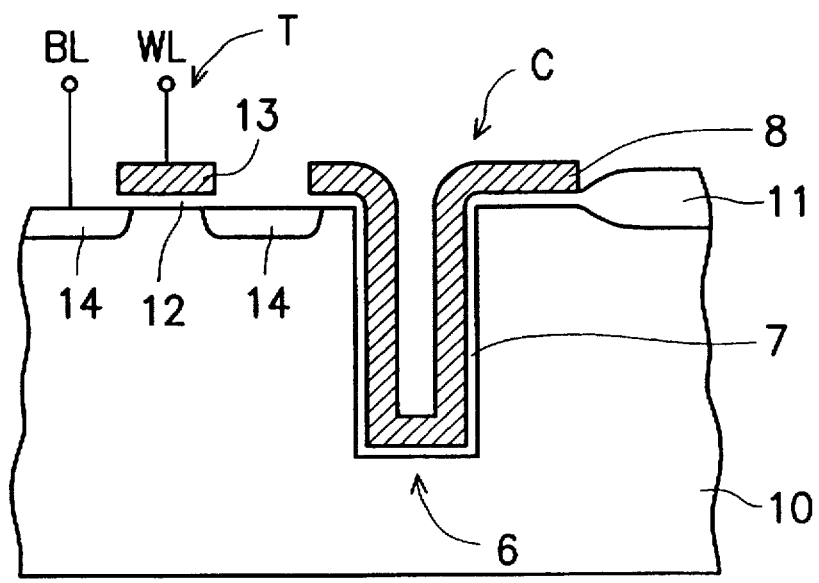
FIG. 4 is a cross-sectional diagram illustrating the structure of a conventional memory cell with a trench-type capacitor.

As shown in FIG. 2, conventionally a field oxide layer 11 is formed on a silicon substrate 10 to define the area of an active region. Next, gate oxide layer 12, polysilicon gate electrode layer 13 and doped source-drain areas 14 are formed in sequence to construct the transfer transistor T. Up to this point in the process, the method according to the invention is same as the conventional process of FIG. 2. For convenience and simplification in illustrating the invention, the above mentioned structure of the transfer transistor, etc., will be illustrated only as a flat substrate 20 in FIGS. 5A to 5E.

Figure 5A:
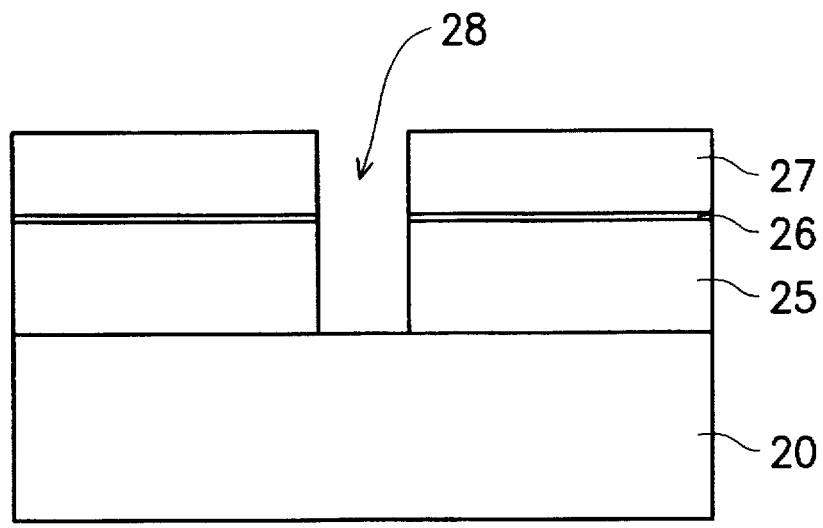
FIGS. 5A to 5F are cross-sectional diagrams illustrating the fabrication process of a memory cell structure according to a first preferred embodiment of the present invention.

Referring FIG. 5A, a first insulating layer 25, a second insulating layer 26 and a third insulating layer 27 are formed in sequence on the substrate 20. For example, first, a borophosphosilicate glass first insulating layer 25 is formed to a thickness of about 7000 Å as a passivation layer by chemical vapor deposition (CVD). Next, a silicon nitride second insulating layer 26 is deposited with a thickness of about 1000 Å as a etching protecting layer by CVD. Then, after depositing a silicon oxide third insulating layer 27 with a thickness of about 7000 Å, the third, second, and first insulating layers 27, 26 and 25 are selectively etched through down to the surface of the substrate 20 to form a contact opening 28 exposing one of the source-drain electrode areas (not shown in FIG. 5, but refer to 14 in FIG. 2 for example) as a contact area.

Figure 5B:
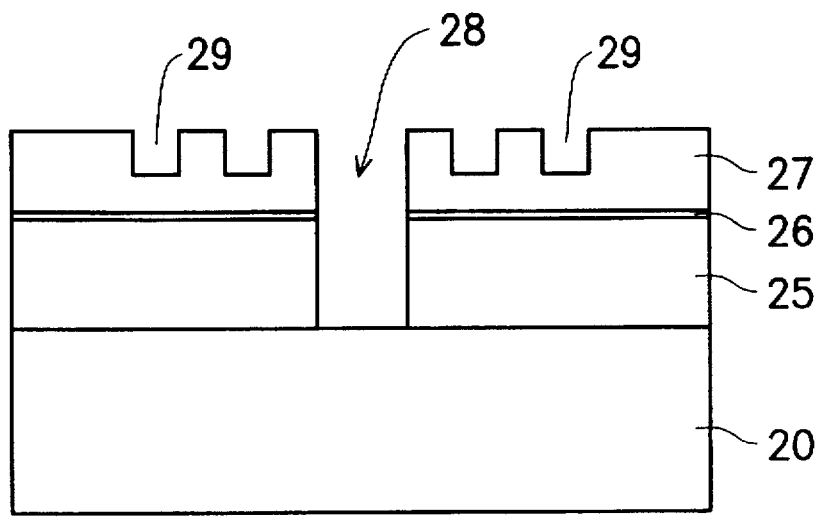

Referring to FIG. 5B, using photolithography and etching, a plurality of first trenches 29 are formed on an upper portion of the third insulating layer 27. For example, the upper portion of the above mentioned silicon oxide layer 27 is etched by reactive ion etching (RIE) to a predetermined depth. The shape of the first trenches 29 could be rectangular, cylindrical or polygonal, for example, and the number of trenches may be adjusted as needed.

Figure 5C:
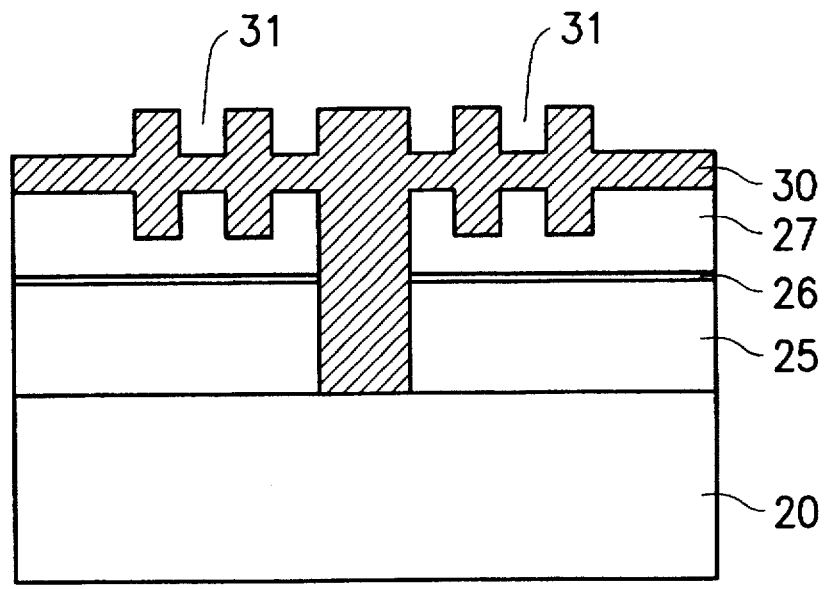

As shown in FIG. 5C, a first conductive layer 30 is formed over the third insulating layer 27 filling the contact opening and the plurality of first trenches 29. For example, a polysilicon first conducting layer 30 is deposited with a thickness of about 7000 Å by CVD. Thereafter, a plurality of second trenches 31 are formed on an upper portion of the first conductive layer 30. The shape of the second trenches 31 could be rectangular, cylindrical or polygonal, for example. Also, in the illustrated exemplary embodiment, the second trenches and the first trenches are disposed to be complementary to each other.

Figure 5D:
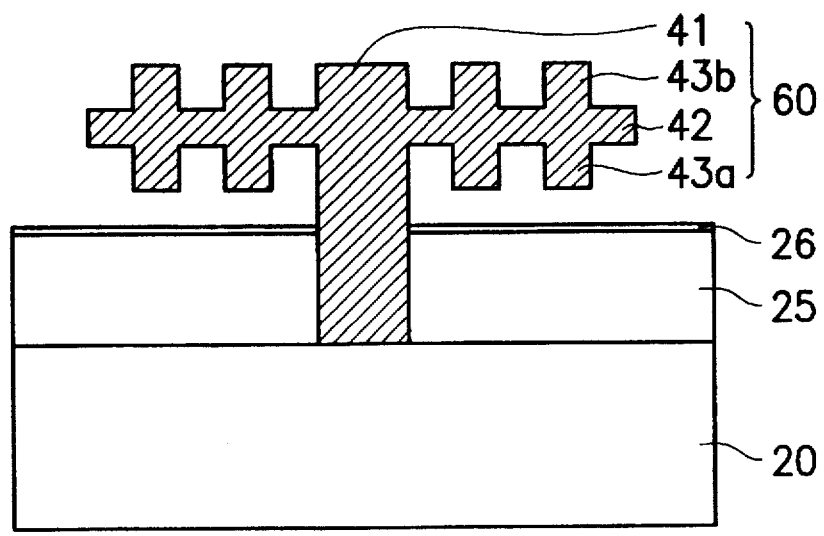

As illustrated in FIG. 5D, using photoresist mask (not shown), the first conductive layer 30 is etched by anisotropic etching, e.g., reactive ion etching, to define a pattern area of the capacitor. After the photoresist is removed, using the second insulating layer 26 (silicon nitride) as an etching stop, the third insulating layer 27 (silicon oxide layer) is removed by isotropic etching, e.g., wet etching using, for example, HF (hydrofluoric acid) or B.O.E.(buffered oxide etchant). Up to this point in the process, the structure of the first conductive layer 30 defines the storage electrode 60 of a capacitor including a vertical frame 41 and a horizontal plate 42. The vertical frame 41 is coupled to the contact area of the substrate 20 through the contact opening 28. The horizontal plate 42 has a plurality of extending areas 43a and 43b which bulge out (extend) vertically and are disposed symmetrically on its upper and lower surfaces as shown.

Figure 5E:
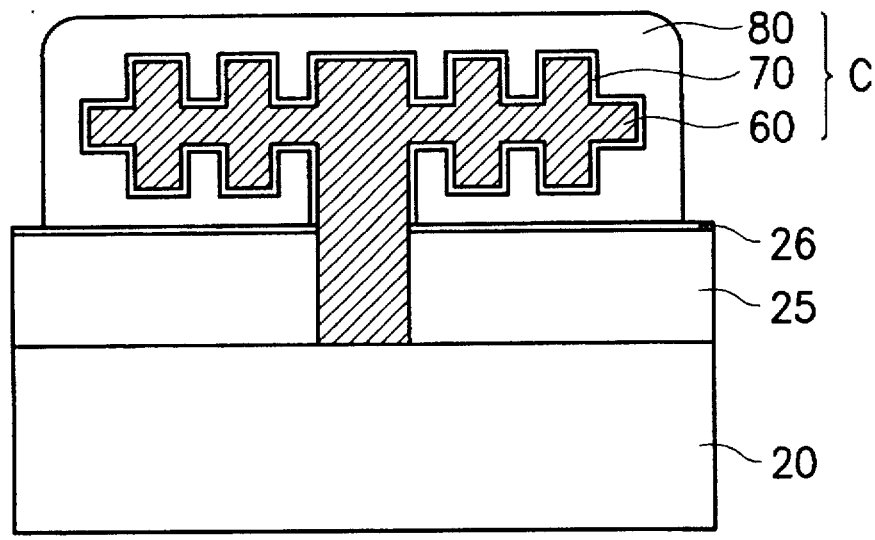

As shown in FIG. 5E, a dielectric layer 70 is formed on the storage electrode 60. The dielectric layer 70 could be a two layer structure, e.g., silicon nitride/silicon dioxide (NO) layers, or a three layer structure, e.g., silicon dioxide/silicon nitride/silicon dioxide (ONO) layers or other materials could be used, such as tantalum oxide, barium titanic acid, or strontium titanic acid. On the surface of the dielectric layer 70, an opposed electrode 80 is formed, thus completing the fabrication of the capacitor of a DRAM memory cell. For example, opposed electrode 80 could be a polysilicon layer deposited to a thickness of about 1000 Å by CVD. The polysilicon layer 80 could also be implanted with impurities to increase conductivity. Then, a pattern area of the polysilicon layer 80 is defined by photolithography and etching to form the opposed electrode of the capacitor C. The above mentioned storage electrode 60, the dielectric layer 70 and the opposed electrode 80 together form capacitor C.

For convenience and simplification of description and illustration, the semiconductor substrate 20 is shown flat in the figures. That is, any roughness of the surface caused by the field oxide layer 11 and the polysilicon gate layer 13 is not shown in the previous figures. When considering the surface roughness, the structure of the DRAM memory cell according to the present invention will be the structure illustrated in FIG. 5F. It is clear that in either FIGS. 5E or 5F, the horizontal plate 42 of the storage electrode 60 has a plurality of extending areas on its upper and lower surfaces that increase the surface area of the storage electrode 60 to provide more capacitance within the same horizontal dimensions. By controlling the quantity of extending areas 43a and 43b to thereby adjust the surface area of the storage electrode 60, the required capacitance is achieved.

Embodiment 2

First, performing the process steps as shown in FIGS. 5A to 5B and already described, a first insulating layer 25, a second insulating layer 26 and a third insulating layer 27 are formed in sequence on a substrate 20, and etched to form a contact opening 28 and a plurality of first trenches 29. Next, referring to FIG. 6A, a first conductive layer 30 is formed over the third insulating layer 27 filling the contact opening 28 and the first trenches 29. For example, a polysilicon conducting layer 30 is deposited to a thickness of about 7000 Å by CVD. Thereafter, using photolithography and etching, a plurality of second trenches 31 are formed on an upper portion of the first conductive layer 30. The shape of the second trenches 31 could be rectangular, cylindrical or polygonal, for example, and the number of second trenches could be adjusted as needed.

Performing the process shown in FIG. 5D of embodiment 1, a pattern area of the first conductive layer 30 is defined by anisotropic etching to construct the storage electrode 60 of a capacitor. The third insulating layer 27 is removed by isotropic etching to obtain a structure with a vertical frame 41 and a horizontal plate 42, as shown in FIG. 6B. The vertical frame 41 is coupled to the contact area of the substrate 20 through the contact opening 28. The horizontal plate 42 has a plurality of extending areas 43a and 43b which extend out vertically and are disposed asymmetrically on the upper and lower surfaces of the horizontal plate 42.

Figure 6A:
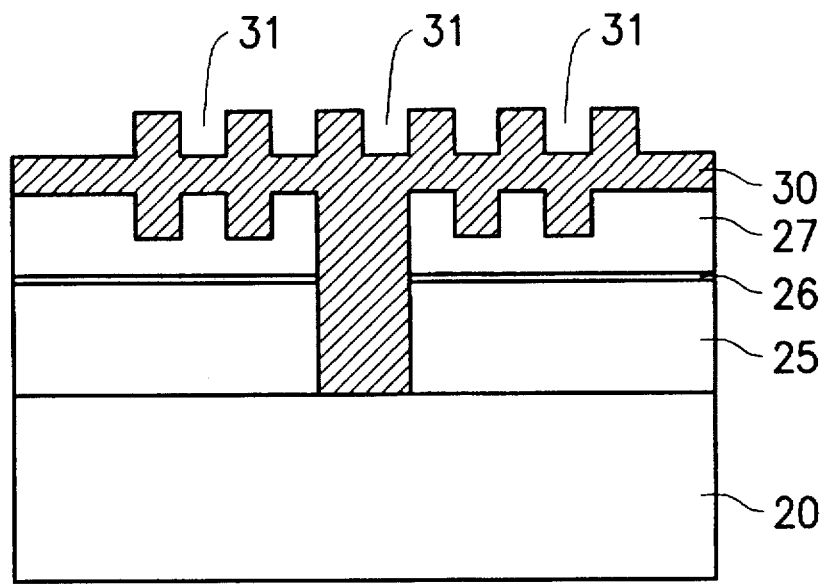
FIG. 6A to 6D are cross-sectional diagrams illustrating the fabrication process of a memory cell structure according to a second preferred embodiment of the present invention.
Figure 6B:
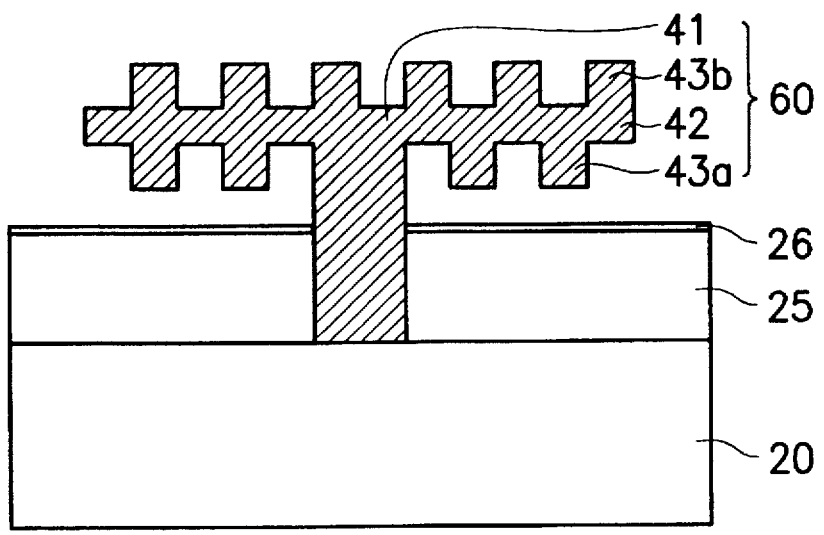
Figure 6C:
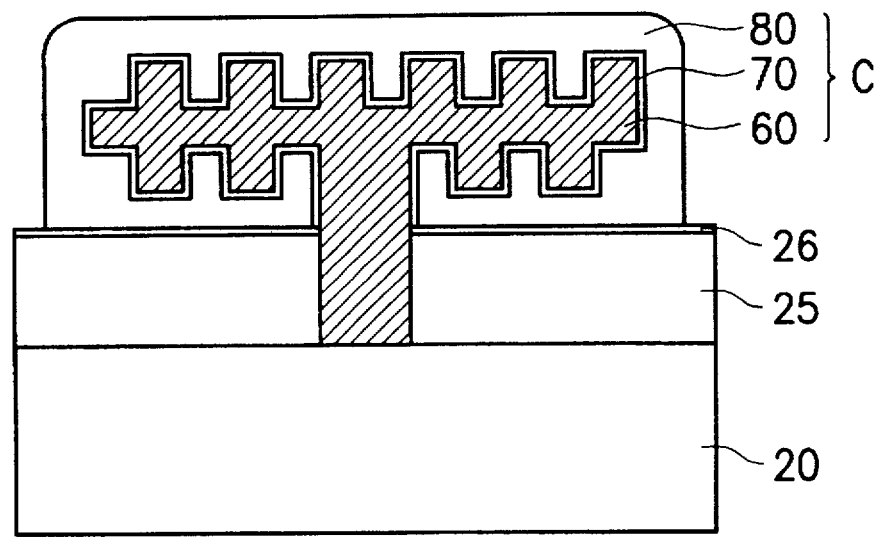

As shown in FIG. 6C, a dielectric layer 70 is formed on the storage electrode 60. The dielectric layer 70 could be a two layer structure, e.g., silicon nitride/silicon dioxide (NO) layers, or a three layer structure, e.g., silicon dioxide/silicon nitride/silicon dioxide (ONO) layers or other materials, such as tantalum oxide, barium titanic acid, or strontium titanic acid. Thereafter, a polysilicon layer is deposited to a thickness of about 1000 Å by CVD. The polysilicon layer could be implanted with impurities to increase conductivity. Then, a pattern area of the polysilicon layer is defined by photolithography and etching to form opposed electrode 80 of the capacitor. The storage electrode 60, the dielectric layer 70 and the opposed electrode 80 together form a capacitor C, thus completing the process of fabricating a DRAM memory cell.

Figure 6D:
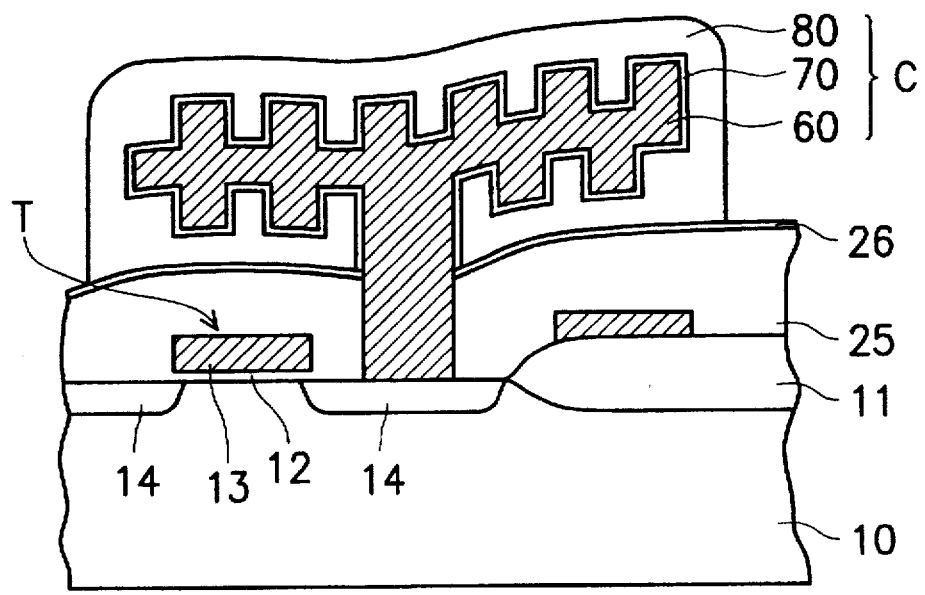

For the convenience of description and illustration, the semiconductor substrate 20 is shown flat in FIGS. 6A to 6C. However, considering surface roughness, the structure of the DRAM memory cell according to the present invention would be the structure as shown in FIG. 6D. It is clear that in FIGS. 6C or 6D, the horizontal plate 42 of the storage electrode 60 has a plurality of extending areas on the upper and lower surfaces that could increase the surface area of the storage electrode 60 to provide more capacitance within the same horizontal dimensions.

Embodiment 3

In the first and second exemplary embodiments, since the first conductive layer 30 is deposited to fill the contact opening 28 and the first trenches 29 at the same time, as the depth difference between the contact opening 28 and the first trenches 29 increases, it becomes difficult to obtain a planar surface. Thus, the third exemplary embodiment is provided as another solution to the stated problem.

Figure 7A:
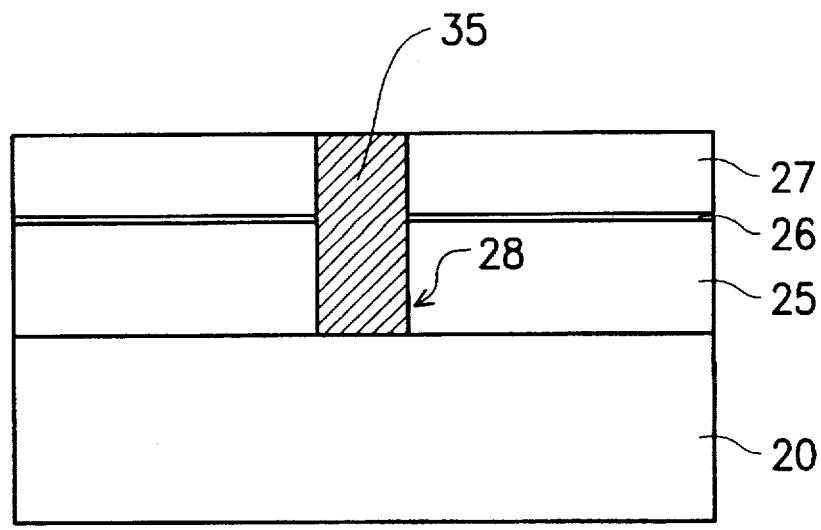
FIGS. 7A to 7B are cross-sectional diagrams illustrating the fabrication process of a memory cell structure according to a third preferred embodiment of the present invention.

Referring to FIG. 7A, a substrate 20 is provided having a field oxide layer, a gate oxide layer, a gate polysilicon layer and source-drain electrode areas, which are not shown for simplification of illustration and explanation. A first insulating layer 25, a second insulating layer 26, and a third insulating layer 27, e.g., a borophosphosilicate glass layer 25, a silicon nitride layer 26 and a silicon oxide layer 27, are formed on substrate 20 in sequence. A contact opening 28 is formed by photolithography and etching exposing one of the source-drain electrode areas as a contact area. Thereafter, a columnar conductive layer 35, e.g., a polysilicon layer, is formed to fill the contact opening 28 by CVD.

Figure 5F:
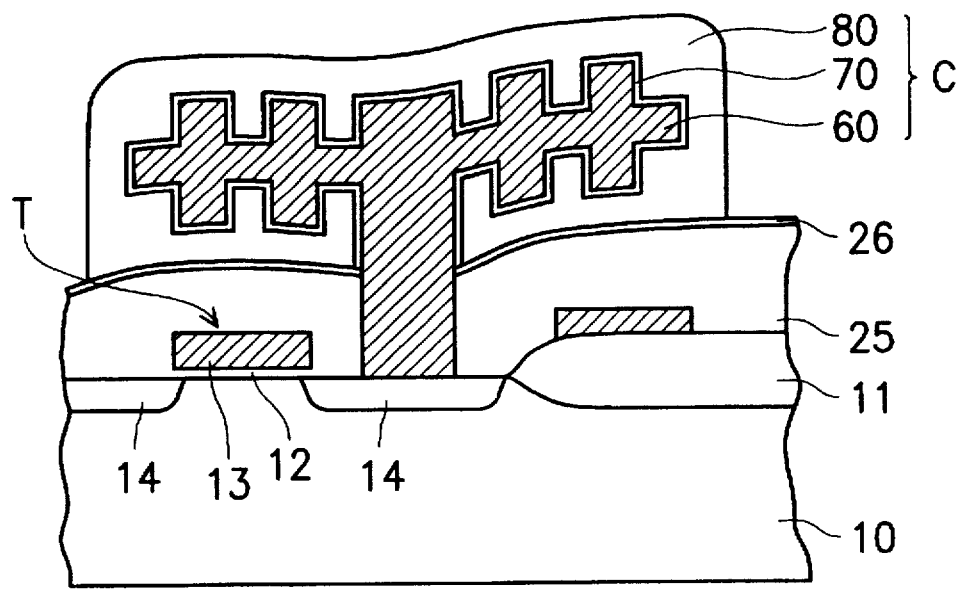
Figure 7B:
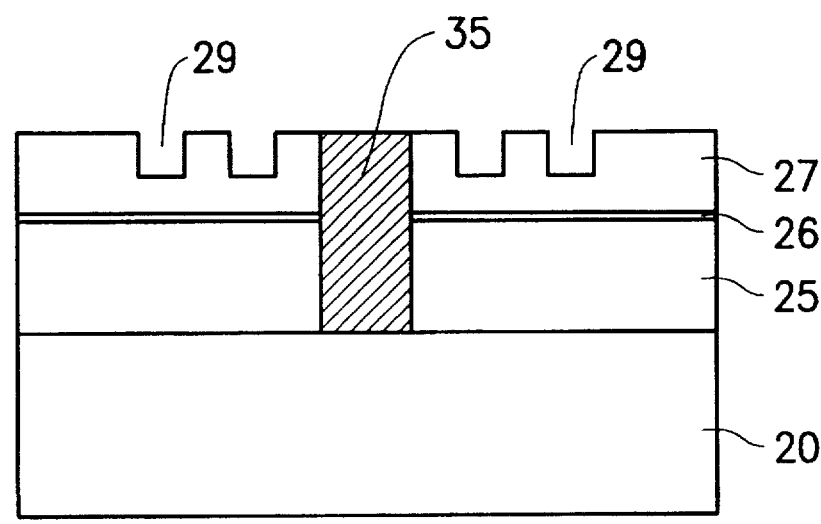

In FIG. 7B, using photolithography and etching, a plurality of a first trenches 29 are formed on an upper portion of the third insulating layer 27. Thereafter, performing the processing as shown in FIGS. 5C to 5E, or the processing as shown in FIGS. 6A to 6C, a DRAM structure, as shown in FIGS. 5F or 6D, will be obtained. The structure formation according to this embodiment is easier to perform because the first conductive layer is here only formed to fill the first trenches 29 and not to also fill the contact opening. The storage electrode 60 is constructed by the columnar conductive layer 35 and the first dielectric layer 30. The capacitance is raised due to the horizontal plate having a plurality of extending areas on its upper and lower surfaces.

Embodiment 4

As shown in FIG. 2, conventionally a field oxide layer 11 is formed on a silicon substrate 10 to define the area of an active region. Next, a gate oxide layer 12, a gate polysilicon layer 13 and doped source-drain areas 14 are formed in sequence to construct a transfer transistor T. Up to this point, the method according to the invention is same as the conventional process of FIG. 2. For convenience of description and simplification in illustrating the invention, the above mentioned structure of the transfer transistor, etc., will be shown only as a flat substrate 20 in FIGS. 8A to 8E.

Figure 8A:
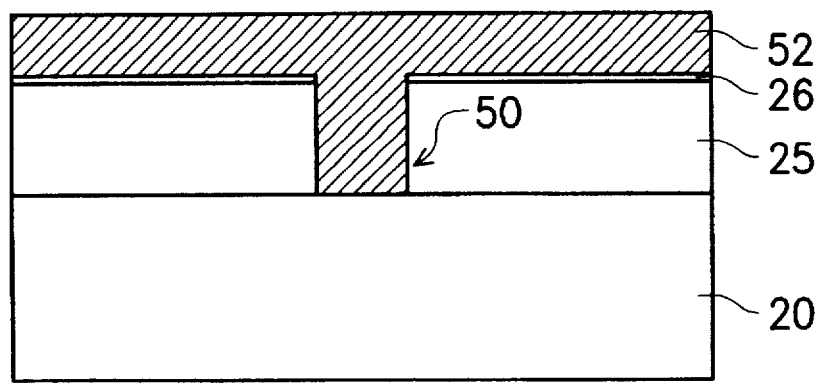
FIG. 8A to 8F are cross-sectional diagrams illustrating the fabrication process of a memory cell structure according to a fourth preferred embodiment of the present invention.

Referring to FIG. 8A, a first insulating layer 25 and a second insulating layer 26 are deposited in sequence on the substrate 20. For example, first, a borophosphosilicate glass first insulating layer 25 is deposited to a thickness of about 7000 Å as a passivation layer by chemical vapor deposition (CVD). Next, a silicon nitride second insulating layer 26 is deposited by CVD to a thickness of about 1000 Å as a etching protecting layer. The second and first insulating layers 26, 25 are selectively etched through down to the surface of the substrate 20 to form a first contact opening 50 exposing one of the source-drain electrode areas (not shown) as a contact area. Then, a first conductive layer 52, e.g., a polysilicon layer, is formed over the second insulating layer 26 to a thickness of about 5000 Å by CVD filling the first contact opening 50. The polysilicon layer 52 contacts the contact area of the substrate through the first contact opening 50.

Figure 8B:
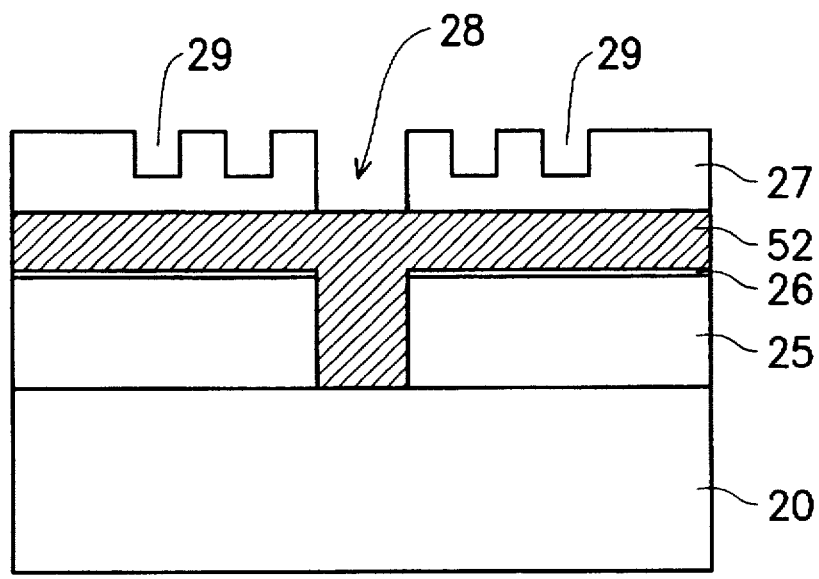

Referring next to FIG. 8B, a third insulating layer 27 is formed over the first conductive layer 52. For example, a silicon oxide third insulating layer 27 is deposited to a thickness of about 7000 Å by CVD. Using photolithography and etching, a second contact opening 28 is formed on the third insulating layer 27 directly above the first contact opening 50 exposing the surface of the conductive layer 52, and a plurality of first trenches 29 are formed on an upper portion of the third insulating layer 27. The shape of the first trenches 29 could be rectangular, cylindrical or polygonal, for example, and the number of first trenches 29 can be adjusted as needed.

Figure 8C:
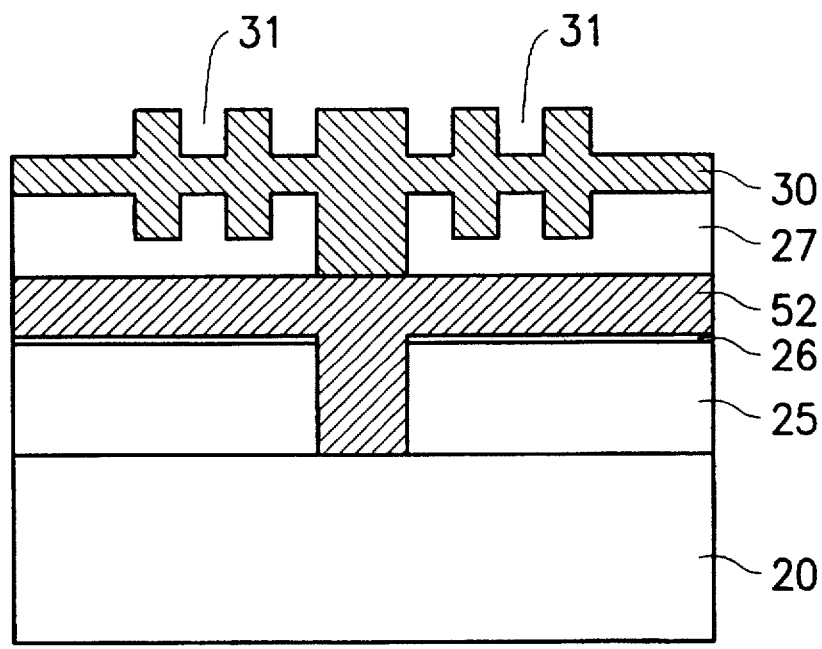

As shown in FIG. 8C, a second conductive layer 30 is formed over the third insulating layer 27 filling the second contact opening 28 and the plurality of first trenches 29. For example, a polysilicon second conductive layer 30 is deposited to a thickness of about 7000 Å by CVD and coupled to the first conductive layer 52 through the second contact opening 28. Thereafter, a plurality of second trenches 31 are formed on an upper portion of the second conductive layer 30. The shape of the second trenches 31 could be rectangular, cylindrical or polygonal, and their number can be adjusted as needed. As illustrated, in this exemplary embodiment, the second trenches and the first trenches are disposed to be complementary to each other.

Figure 8D:
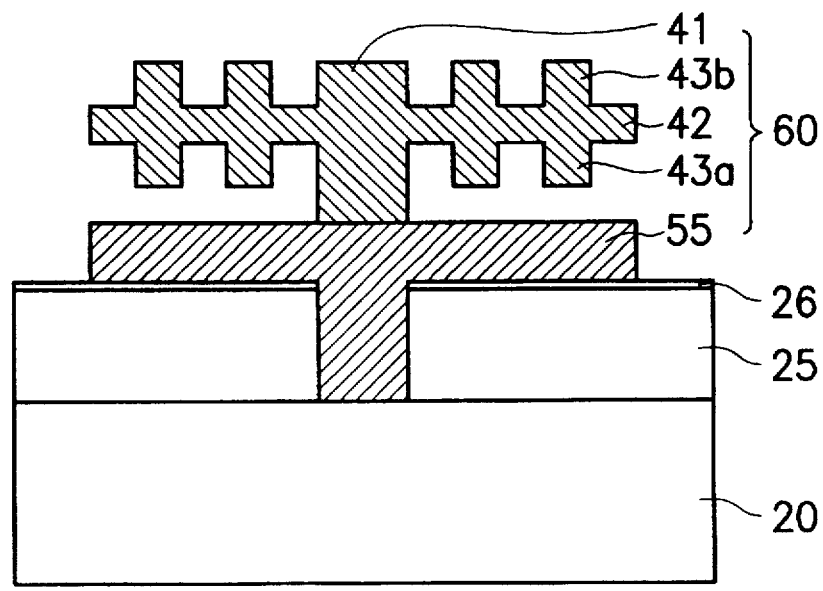

As illustrated in FIG. 8D, using a photoresist mask (not shown), the second conductive layer 30, the third insulating layer 27 and the first conductive layer 52 are etched by anisotropic etching, e.g., reactive ion etching, to define a pattern area of the capacitor. After the photoresist is removed, using the second insulating layer 26 (silicon nitride) as an etching stop, the third insulating layer 27 (silicon oxide layer) is removed by isotropic etching, e.g., wet etching using for example, HF (hydrofluoric acid) or B.O.E.(buffered oxide etchant). Up to this point in the process, the structure of the first and second conductive layers 52, 30 defines the storage electrode 60 of a capacitor, which includes a vertical frame 41, a first horizontal plate 55 and a second horizontal plate 42. The vertical frame 41 contacts the contact area of the substrate 20 through the contact openings 28 and 50. The first and second horizontal plates 55, 42 are formed apart in sequence and extend parallel with the surface of the second insulating layer 26. The second horizontal plate 42 has a plurality of extending areas 43a and 43b extending out vertically and formed symmetrically on the upper and lower surfaces of the horizontal plate 42 as shown.

Figure 8E:
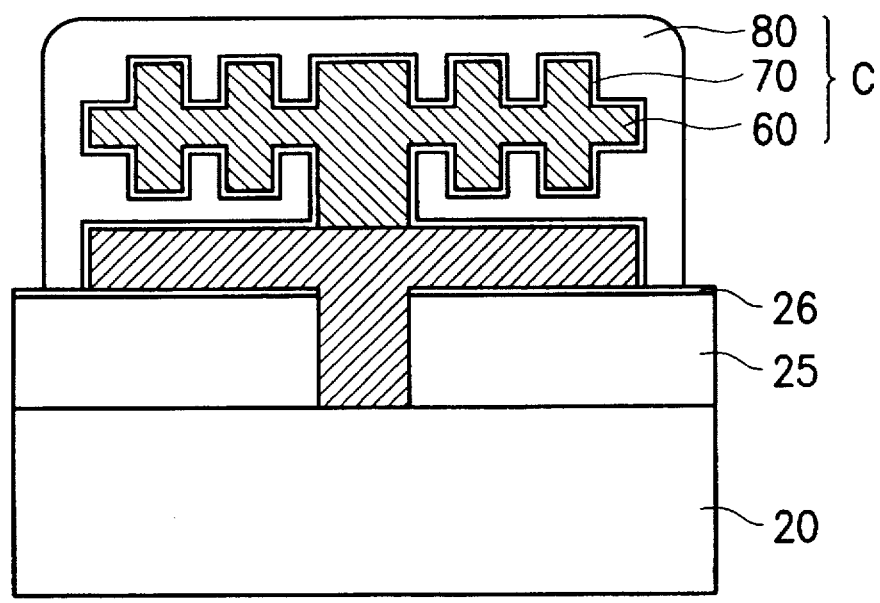

As illustrated in FIG. 8E, a dielectric layer 70 is formed over the exposed surface of the storage electrode 60. The dielectric layer 70 could be a two layer structure, e.g., silicon nitride/silicon dioxide (NO) layers, or a three layer structure, e.g., silicon dioxide/silicon nitride/silicon dioxide (ONO) layers or other materials could be used such as tantalum oxide, barium titanic acid, or strontium titanic acid. On the surface of the dielectric layer 70, an opposed electrode 80 is formed, thus completing the fabrication of the capacitor of a DRAM memory cell. For example, a polysilicon layer is deposited to a thickness of about 1000 Å by CVD. The polysilicon layer could be implanted with impurities to increase conductivity. Then, a pattern area of the polysilicon layer is defined by photolithography and etching to form opposed electrode 80 of the capacitor. Thus, the storage electrode 60, the dielectric layer 70 and the opposed electrode 80 together form capacitor C.

Figure 8F:
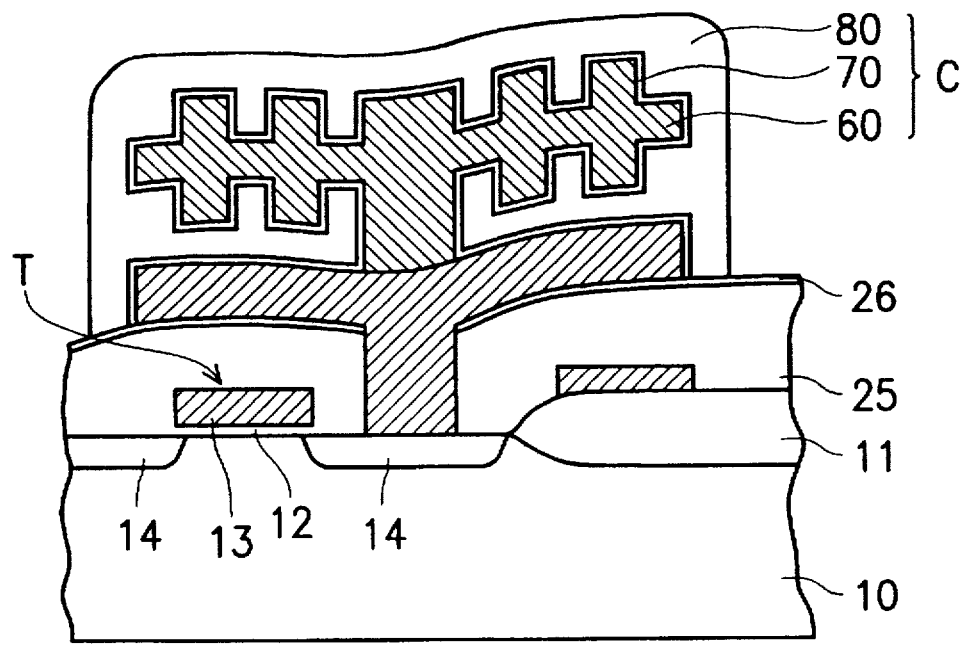

When considering the roughness caused by field oxide layer 11 and polysilicon gate layer 13, for example, the structure of the DRAM memory cell according to the present invention will be the structure as shown in FIG. 8F. It is clear that in either FIGS. 8E or 8F, the second horizontal plate 42 of the storage electrode 60 formed with a plurality of extending areas on both the upper and lower surfaces, increases the surface area of the storage electrode 60. Since the first horizontal plate 55 provides an additional surface, the capacitance of this embodiment is significantly higher than the capacitance of embodiments 1, 2 and 3 for example.

Embodiment 5

Figure 9A:
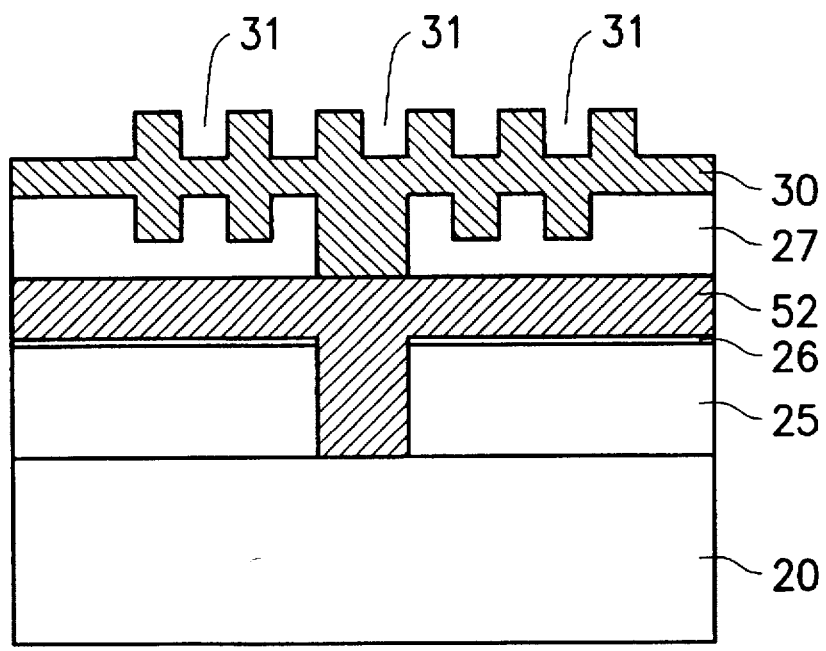
FIG. 9A to 9D are cross-sectional diagrams illustrating the fabrication process of a memory cell structure according to a fifth preferred embodiment of the present invention.

This exemplary embodiment is based on the structure and fabrication process of FIGS. 8A and 8B of exemplary embodiment 4. Referring to FIG. 9A, a second conductive layer 30 is formed over the third insulating layer 27 filling the second contact opening 28 and the plurality of first trenches 29. For example, a polysilicon second conductive layer 30 is deposited to a thickness of about 7000 Å by CVD, and coupled to the first conductive layer 52 through the second contact opening 28. Then, using photolithography and etching, a plurality of second trenches 31 are formed on an upper portion of the second conductive layer 30 in a different orientation from the previous embodiment.

Figure 9B:
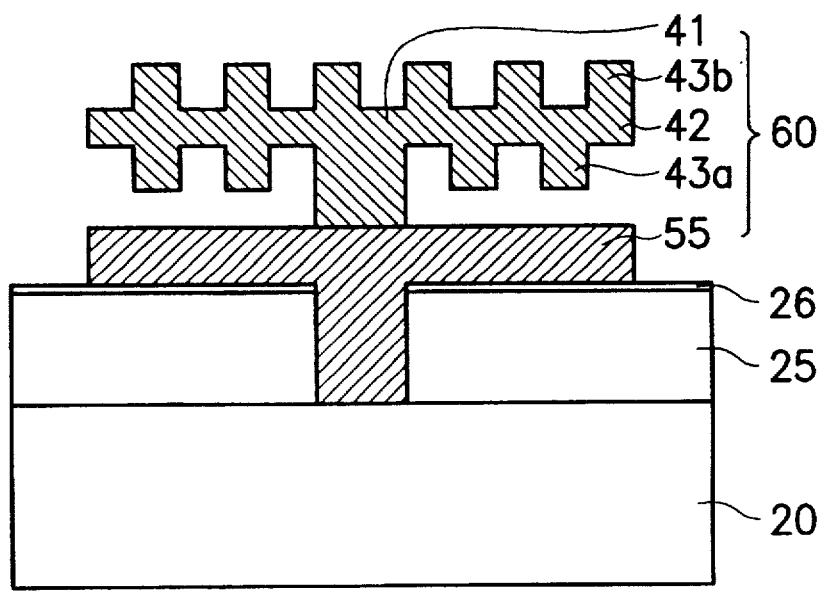

Next, performing the process as shown in FIG. 8D, using anisotropic etching, a pattern area is defined by etching the second conductive layer 30, the third insulating layer 27 and the first conductive layer 52. Then the second insulating layer 26 is removed by isotropic etching to obtain the storage electrode 60 of a capacitor as shown in FIG. 9B. The storage electrode 60 includes a vertical frame 41, a first horizontal plate 55 and a second horizontal plate 42. The vertical frame 41 is coupled to the contact area of the substrate 20 through the contact openings 28 and 50. The second horizontal plate 42 has a plurality of extending areas 43a and 43b extending out vertically from upper and lower surfaces of the horizontal plate 42, but in a different shape than in the fourth embodiment.

Figure 9C:
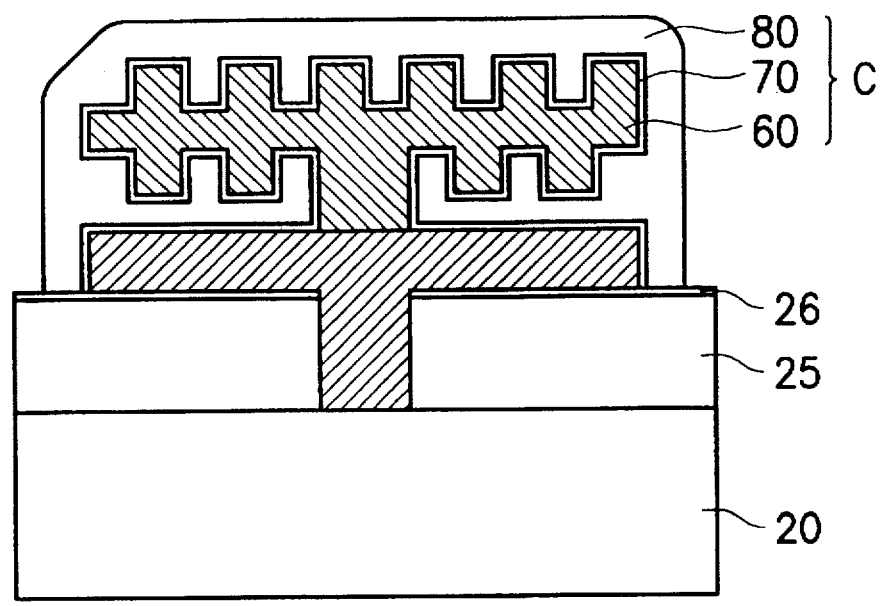
Figure 9D:
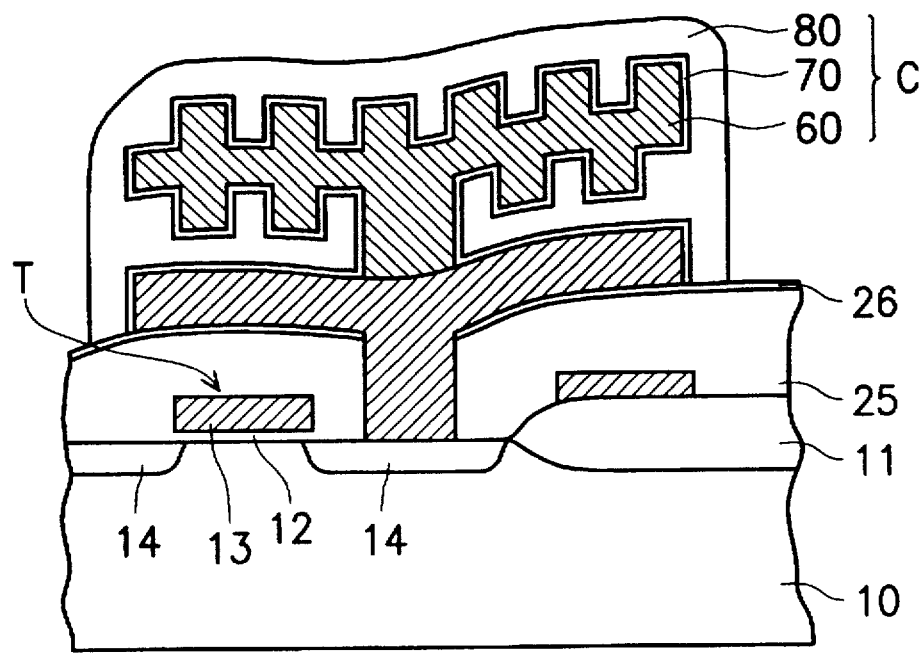

As shown in FIG. 9C, a dielectric layer 70 is formed over the exposed surface of the storage electrode 60. An opposed electrode 80 is formed on the surface of the dielectric layer 70. Thus, the storage electrode 60, the dielectric layer 70 and the opposed electrode 80 together form a capacitor C. The steps and the exemplary materials used in this process are the same as in the above previously mentioned embodiments.

When considering the roughness caused by field oxide layer 11 and polysilicon gate layer 13, for example, the structure of the DRAM memory cell according to the present invention will be the structure as shown in FIG. 9F. It is clear that in FIG. 8F, the surface area of the storage electrode 60 is significantly increased which efficiently raises the capacitance.

Embodiment 6

Figure 10A:
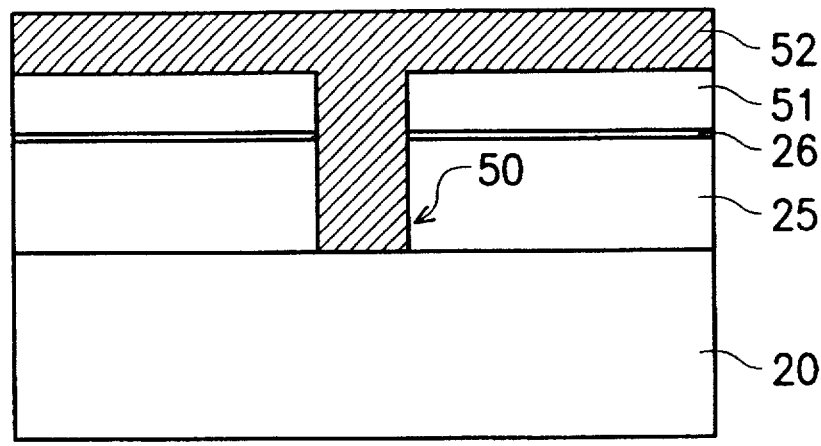
FIG. 10A to 10F are cross-sectional diagrams illustrating the fabrication process of a memory cell structure according to a sixth preferred embodiment of the present invention.

This exemplary embodiment is based on the process and structure of exemplary embodiment 4 previously described. With reference to FIG. 10A, a first insulating layer 25, a second insulating layer 26 and a third insulating layer 51 are formed in sequence on the substrate 20. For example, a borophosphosilicate glass first insulating layer 25, a silicon nitride second insulating layer 26 and a silicon oxide third insulating layer 51 are formed by CVD. The third, second and first insulating layers 51, 26, 25 (in that order) are selectively etched through down to the surface of the substrate 20 to form a first contact opening 50 for exposing one of the source-drain electrode areas (not shown) as a contact area. Then, a first conductive layer 52, e.g., a polysilicon layer, is formed over the third insulating layer 51 to a thickness of about 5000 Å by CVD also filling the first contact opening 50, and making contact with the contact area on the substrate 20 through the first contact opening 50.

Figure 10B:
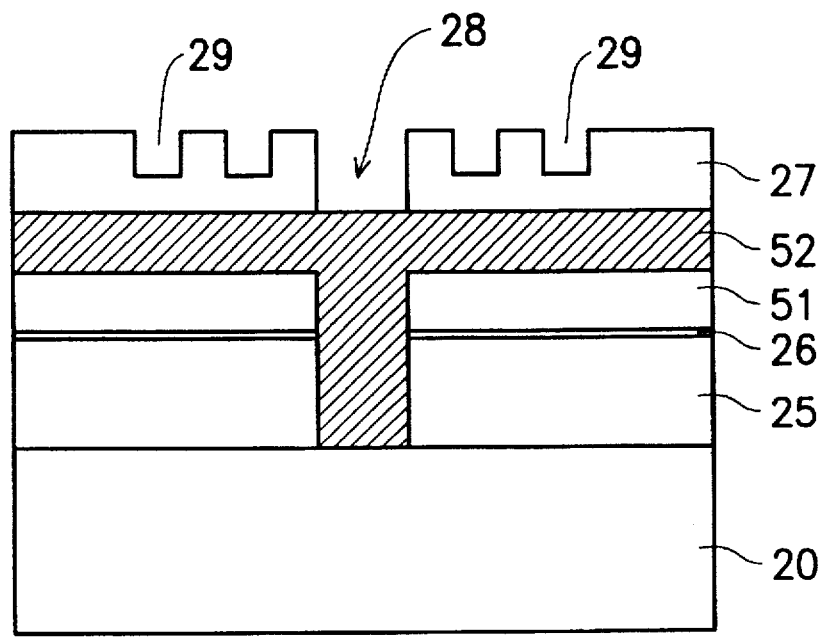

Referring to FIG. 10B, a fourth insulating layer 27 is formed over the first conductive layer 52. For example, a silicon oxide fourth insulating layer 27 is deposited to a thickness of about 7000 Å by CVD. Using photolithography and etching, a second contact opening 28 is formed on the fourth insulating layer 27 directly above the first contact opening 50 exposing the surface of the first conductive layer 52, and a plurality of first trenches 29 are formed on an upper portion of the fourth insulating layer 27. The shape of the first trenches 29 may be rectangular, cylindrical or polygonal, and their number may be adjusted as needed.

Figure 10C:
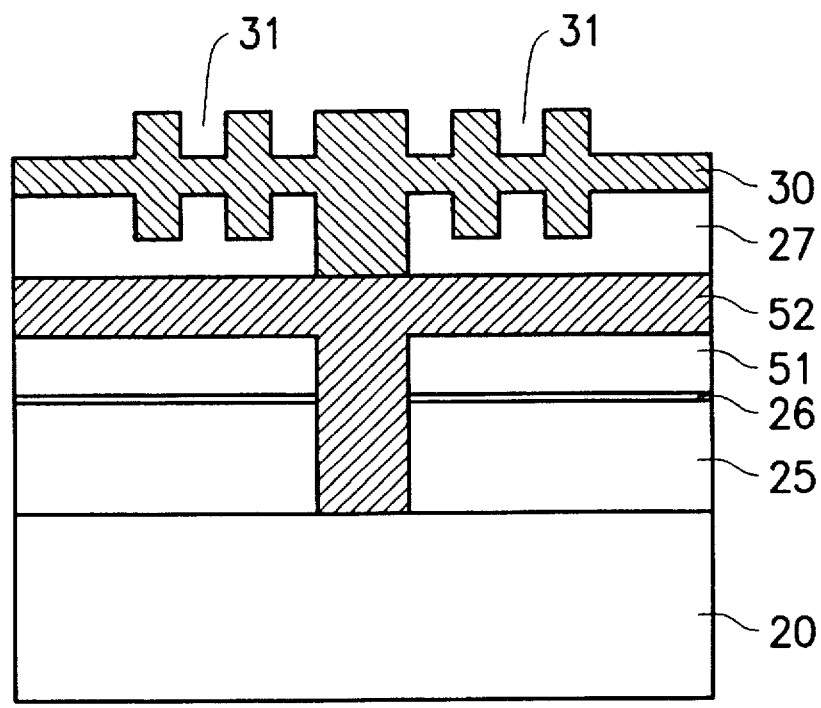

As shown in FIG. 10C, a second conductive layer 30 is formed over the fourth insulating layer 27 filling the second contact opening 28 and the plurality of first trenches 29. For example, a polysilicon layer 30 is deposited to a thickness of about 7000 Å by CVD making contact with the first conductive layer 52 through the second contact opening 28. Thereafter, using photolithography and etching, a plurality of second trenches 31 are formed on an upper portion of the second conductive layer 30. The shape of the second trenches 31 may be rectangular, cylindrical or polygonal, and their number may be adjusted as needed. Also, as shown in the exemplary embodiment, the second trenches 31 and the first trenches 29 are disposed to be complementary to each other.

Figure 10D:
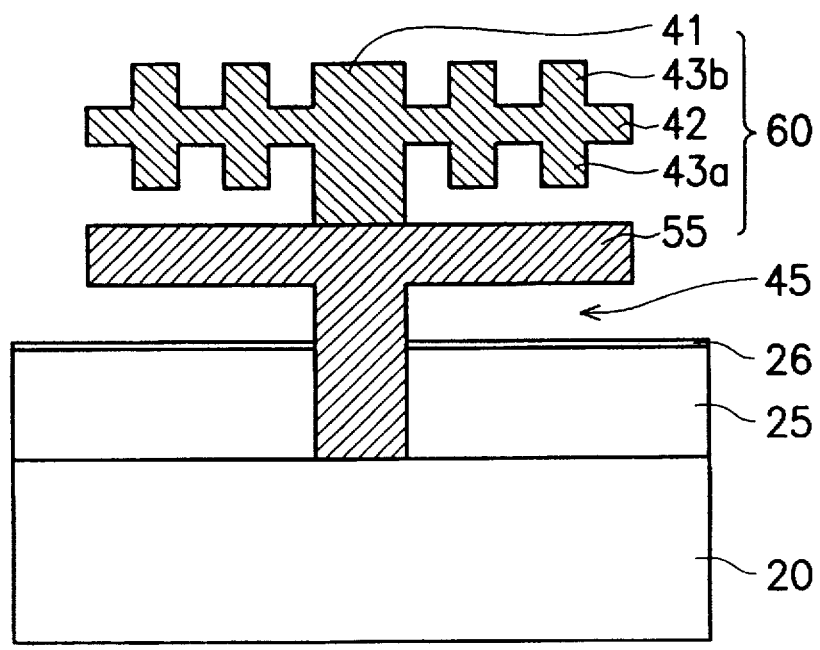

As illustrated in FIG. 10D, using a photoresist mask (not shown), the second conductive layer 30, the fourth insulating layer 27 and the first conductive layer 52 are etched by anisotropic etching, e.g., reactive ion etching to define a pattern area of a capacitor. After the photoresist is removed, using the second insulating layer 26 (silicon nitride layer) as an etching stop, the third insulating layer 51 (silicon oxide layer) is removed by isotropic etching. Up to this point in the process, the structure of the first and second conductive layers 52, 30 defines the storage electrode 60 of a capacitor, which includes a vertical frame 41, a first horizontal plate 55 and a second horizontal plate 42. The vertical frame 41 contacts the contact area of the substrate 20 through the first and second contact openings 28 and 50. The first and second horizontal plates 55, 42 are formed apart in sequence and extend parallel with the surface of the second insulating layer 26. The second horizontal plate 42 has a plurality of extending areas 43a and 43b which extend out vertically and are disposed symmetrically on the upper and lower surfaces of the horizontal plate 42, as shown.

Figure 10E:
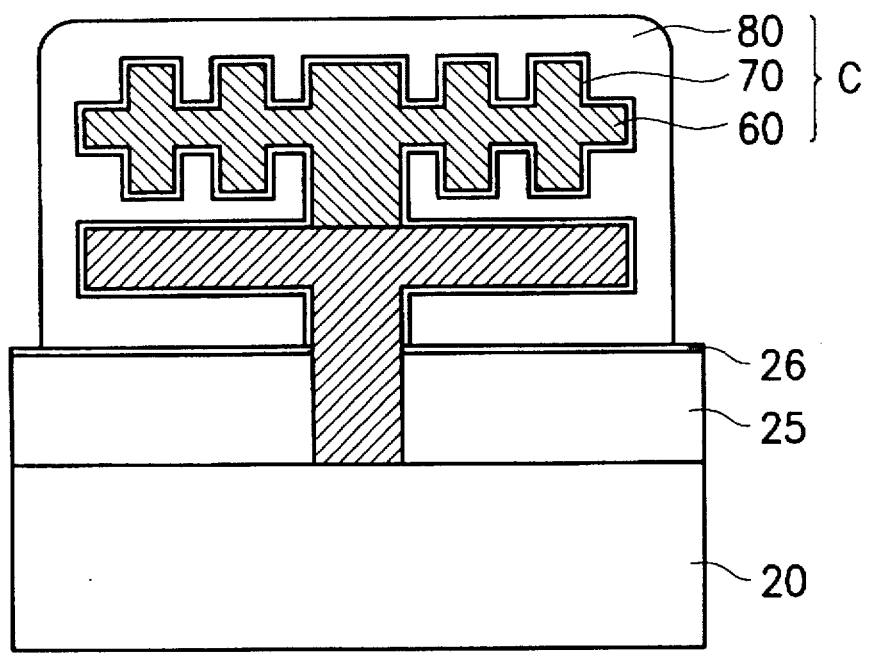

As illustrated in FIG. 10E, a dielectric layer 70 is formed over the exposed surface of the storage electrode 60. On the surface of the dielectric layer 70, an opposed electrode 80 is formed, thus completing the fabrication of the capacitor of a DRAM memory cell. The steps and the exemplary materials used in this part of the process are the same as in the above previously described exemplary embodiments, and therefore will not be described again.

Figure 10F:
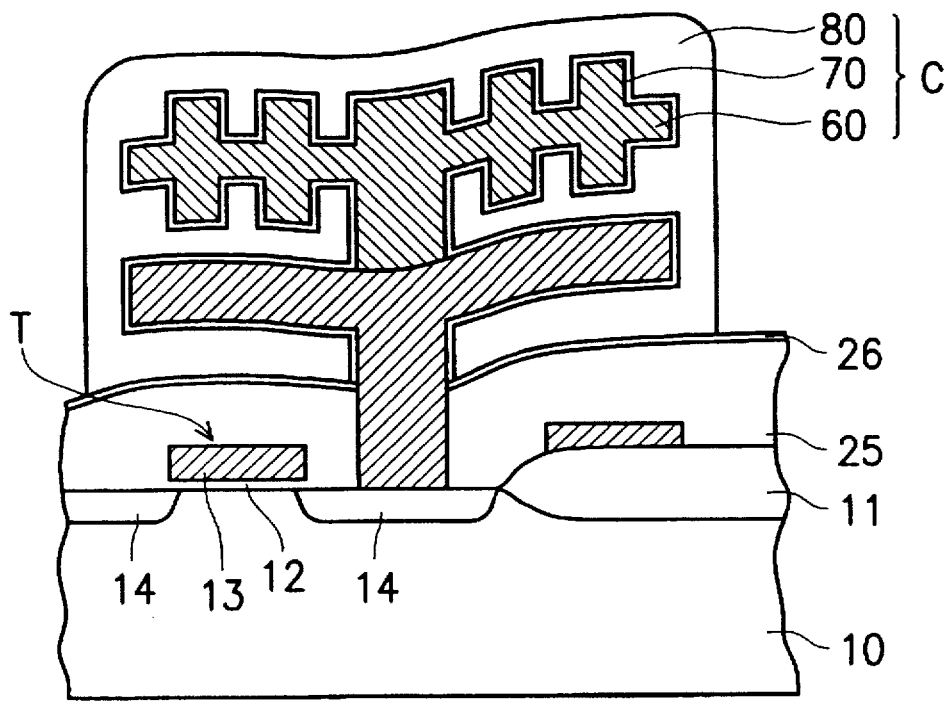

When considering the roughness caused by field oxide layer 11 and polysilicon gate layer 13, for example, the structure of the DRAM memory cell according to the present invention will be the structure as shown in FIG. 10F. It is clear that, in either FIGS. 10E or 10F, the surface area of the storage electrode 60 is significantly increased by virtue of the spacing (gap 45) between the first horizontal plate 55 and the second insulating layer 26 that efficiently increases the capacitance possible.

Embodiment 7

Figure 11A:
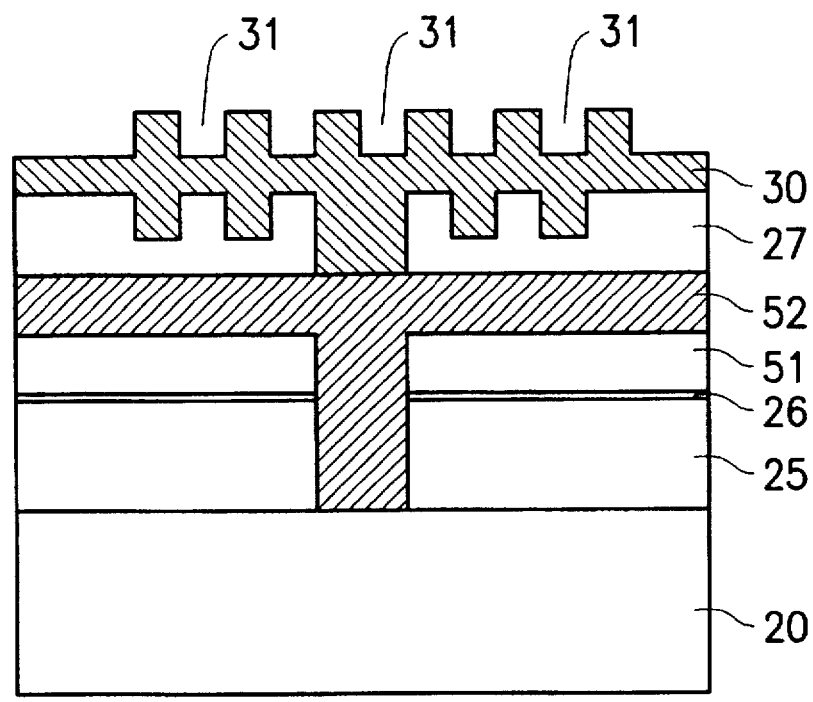
FIG. 11A to 11D are cross-sectional diagrams illustrating the fabrication process of a memory cell structure according to a seventh preferred embodiment of the present invention.

This exemplary embodiment is based on the structure and process of exemplary embodiment 6 shown in FIGS. 10A to 10B and will be described using the same reference numerals. As shown in FIG. 11A, a second conductive layer 30 is formed over the fourth insulating layer 27 filling the second contact opening 28 and the plurality of the first trenches 29. For example, a polysilicon layer 30 is deposited to a thickness of about 7000 Å by CVD and contacts the first conductive layer 52 through the second contact opening 28. Thereafter, using photolithography and etching, a plurality of second trenches 31 are formed on the upper portion of the second conductive layer 30 as illustrated.

Figure 11B:
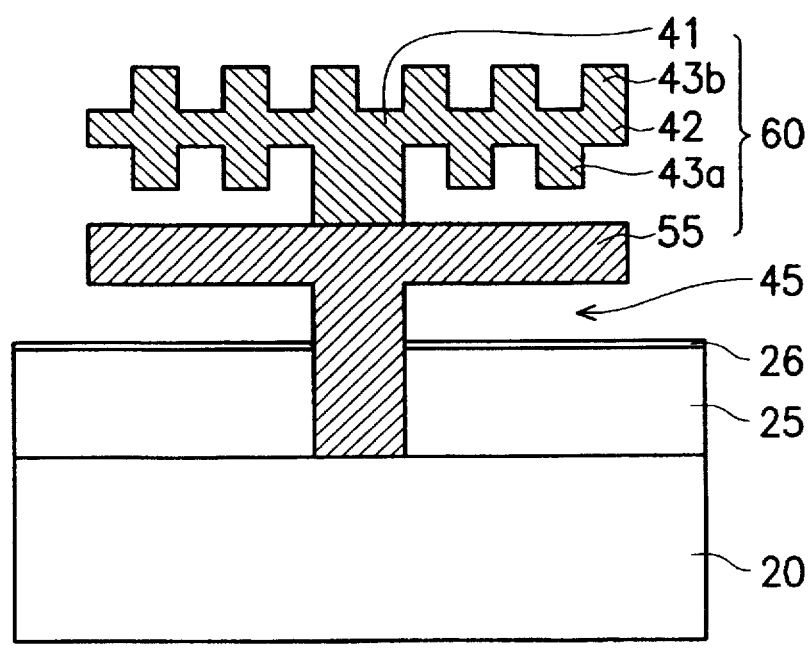

Next, performing the same process as shown in FIG. 10D, the second conductive layer 30, the fourth insulating layer 27, the first conductive layer 52 and the third insulating layer 51 are etched by anisotropic etching to define a pattern area of a capacitor. Then, the fourth and third insulating layers 27, 51 are removed by isotropic etching to obtain the structure as shown in FIG. 11B, forming the storage electrode 60 of a capacitor having the first and second conductive layers 52, 30. The storage electrode 60 includes a vertical frame 41, a first horizontal plate 55 and a second horizontal plate 42. The vertical frame 41 is coupled to the contact area of the substrate 20 through the first and second contact openings 50 and 28. The first and second horizontal plates 55, 42 are formed apart in sequence and extend parallel with the surface of the second insulating layer 26. A gap 45 is thus formed between the first horizontal plate 42 and the second insulating layer 26. The second horizontal plate 42 has a plurality of extending areas 43a and 43b which extend out vertically and are disposed asymmetrically on the upper and lower surfaces of the horizontal plate 42.

Figure 11C:
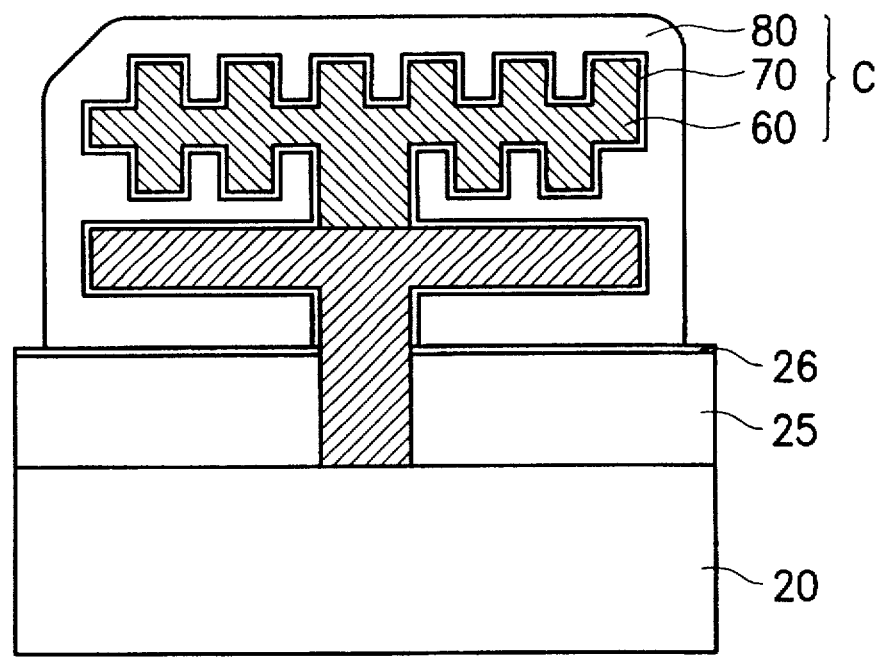

As shown in FIG. 11C, a dielectric layer 70 is formed over the exposed surface of the storage electrode 60. On the surface of the dielectric layer 70, an opposed electrode 80 is formed, thus completing the fabrication of the capacitor of a DRAM memory cell. The steps and the materials used in this process are the same as in the above previously mentioned and illustrated exemplary embodiments, and therefore will not be described again.

Figure 11D:
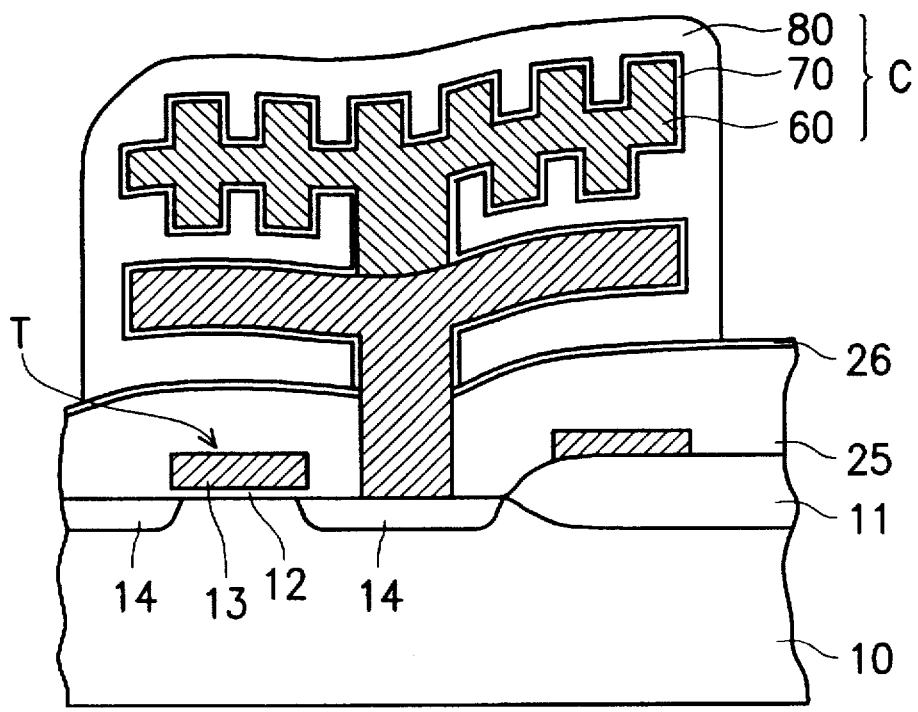

When considering the roughness caused by field oxide layer 11 and polysilicon gate layer 13, for example, the structure of the DRAM memory cell according to the present invention will be the structure as shown in FIG. 11D. It is clear that, in FIG. 11C or 11D, the surface of the storage electrode 60 is significantly increased not only by the structure of the second horizontal plate 42 of the storage electrode 60, but also by virtue of the gap 45 separating the first horizontal plate 55 from the second insulating layer 26 that efficiently increases the capacitance possible.

For those skilled in the art, it should be apparent that the aspects of the previously described preferred embodiments may be used individually or simultaneously, to build a variety of different kinds of storage electrodes. All sorts of variations in the structure of the storage electrodes are considered to be within the scope of the present invention as defined in the claims. It should be noted that although the drain electrodes of the exemplary transfer transistor illustrated are in a diffusion area of the silicon substrate, the present invention is not limited to this particular transistor structure. Other kinds of drain electrode structures could be used with the present invention, such as a trench type drain electrode structure, for example.

While the invention has been described by way of examples and in terms of preferred embodiments, it is to be understood that the invention is not limited to the disclosed exemplary embodiments. To the contrary, the scope of the invention is intended to include various modifications and similar arrangements within the spirit of the invention limited only by the appended claims, which should be accorded the broadest interpretation so as to encompass all such modifications and similar structures.

What is claimed is:

1. A memory cell comprising:

a semiconductor substrate;

a transfer transistor formed on the semiconductor substrate, having a gate electrode and source-drain electrode areas;

an insulating layer formed over the semiconductor substrate and the transfer transistor, having a contact opening exposing one of the source-drain electrode areas as a contact area; and a storage capacitor formed over the insulating layer and electrically coupled to the contact area;

wherein the storage capacitor includes:

a storage electrode being a first conductive layer formed as a vertical frame contacting the contact area through the contact opening and a horizontal plate extending parallel to the insulating layer and having a plurality of extending areas which extend out vertically from upper and lower surfaces thereof and being disposed asymmetrically on the upper and lower surfaces of the horizontal plate, whereby the vertical frame, the horizontal plate and the extending areas together form the storage electrode of the storage capacitor;

a dielectric layer formed on the surface of the first conductive layer; and an opposed electrode being a second conductive layer formed on the dielectric layer, whereby the second conductive layer forms the opposed electrode of the capacitor.

2. A memory cell according to claim 1, wherein the first conductive layer comprises a polysilicon layer.

3. A memory cell according to claim 1, wherein the second conductive layer comprises a polysilicon layer.

4. A memory cell according to claim 1, wherein the insulating layer includes a silicon oxide layer and a silicon nitride layer.

5. A DRAM memory device comprising a plurality of memory cells according to claim 1.

6. A memory cell comprising:

a semiconductor substrate;

a transfer transistor formed on the semiconductor substrate, having a gate electrode and source-drain electrode areas;

an insulating layer formed over the semiconductor substrate and the transfer transistor, having a contact opening exposing one of the source-drain electrode areas as a contact area; and a storage capacitor formed over the insulating layer and electrically coupled to the contact area;

wherein the storage capacitor includes:

a storage electrode being a first conductive layer formed as a vertical frame contacting the contact area through the contact opening, and first and second horizontal plates extending parallel to the insulating layer and separated from each other in the vertical direction, the second horizontal plate having a plurality of extending areas which extend but vertically from upper and lower surfaces thereof and which are disposed asymmetrically on the upper and lower surfaces of the second horizontal plate, whereby the vertical frame, the first and second horizontal plates and the extending areas together form the storage electrode of the storage capacitor;

a dielectric layer formed the surface of the first conductive layer; and an opposed electrode being a second conductive layer formed on the dielectric layer, whereby the second conductive layer forms the opposed electrode of the capacitor.

7. A memory cell according to claim 6, wherein a lower surface of the first horizontal plate extends in contact with the surface of the insulating layer.

8. A memory cell according to claim 6, further wherein the first horizontal layer is separated from the insulating layer by a gap.

9. A memory cell according to claim 6, wherein the first conductive layer comprises a polysilicon layer.

10. A memory cell according to claim 6, wherein the second conductive layer comprises a polysilicon layer.

11. A memory cell according to claim 6, wherein the insulating layer includes a silicon oxide layer and a silicon nitride layer.

12. A DRAM memory device comprising a plurality of memory cells according to claim 1.

13. A memory cell comprising:

a semiconductor substrate;

a transfer transistor formed on the semiconductor substrate, having a gate electrode and source-drain electrode areas;

an insulating layer formed over the semiconductor substrate and the transfer transistor, having a contact opening exposing one of the source-drain electrode areas as a contact area; and a storage capacitor formed on the insulating layer and electrically coupled to the contact area;

wherein the storage capacitor includes:

a storage electrode being a first conductive layer formed as a vertical frame contacting the contact area through the contact opening and at least one horizontal plate extending parallel to the insulating layer, one of the at least one horizontal plates having a plurality of extending areas which extend out vertically from upper and lower surfaces thereof and which are disposed asymmetrically on the upper and lower surfaces of the one horizontal plate, whereby the vertical frame, the at least one horizontal plate and the extending areas together form the storage electrode of the storage capacitor;

a dielectric layer formed on the surface of the first conductive layer; and an opposed electrode being a second conductive layer formed on the dielectric layer, whereby the second conductive layer forms the opposed electrode of the capacitor.

14. The memory cell according to claim 13, wherein the at least one horizontal plate comprises a plurality of horizontal plates.

15. The memory cell according to claim 14, wherein the plurality of horizontal plates comprises two horizontal plates.

* * * * *